(12) United States Patent
Fujiwara et al.

(10) Patent No.: US 7,176,439 B2
(45) Date of Patent: Feb. 13, 2007

(54) METHOD FOR MANUFACTURING PHOTODETECTOR FOR WEAK LIGHT

(75) Inventors: Mikio Fujiwara, Koganei (JP); Masahide Sasaki, Koganei (JP); Makoto Akiba, Koganei (JP)

(73) Assignee: National Institute of Information and Communication Technology, Tokyo (JP)

( * ) Notice: Subject to any disclaimer, the term of this patent is extended or adjusted under 35 U.S.C. 154(b) by 134 days.

(21) Appl. No.: 10/883,989

(22) Filed: Jul. 6, 2004

(65) Prior Publication Data

US 2005/0029434 A1    Feb. 10, 2005

(30) Foreign Application Priority Data

Jul. 9, 2003    (JP) ............................. 2003-272456

(51) Int. Cl.
*H01L 31/00* (2006.01)
(52) U.S. Cl. ................. 250/214.1; 250/214 A
(58) Field of Classification Search ............ 250/214.1, 250/214 A, 214 AL
See application file for complete search history.

(56) References Cited

U.S. PATENT DOCUMENTS

| 5,233,180 | A | * | 8/1993 | Tsuruta et al. ........... 250/208.1 |
| 5,646,573 | A | * | 7/1997 | Bayruns et al. ................ 330/59 |
| 5,929,434 | A | | 7/1999 | Kozlowski et al. ..... 250/214 A |
| 6,773,936 | B2 | | 8/2004 | Fujiwara et al. .............. 438/14 |
| 2001/0017343 | A1 | * | 8/2001 | Ang et al. ................ 250/208.1 |
| 2003/0087508 | A1 | | 5/2003 | Fujiwara et al. ............ 438/466 |

FOREIGN PATENT DOCUMENTS

| EP | 0 897 214 A2 | 2/1999 |
| EP | 0 897 214 A3 | 7/2000 |
| JP | 03-123180 | 5/1991 |
| JP | 07-270825 | 10/1995 |
| JP | 08-032022 | 2/1996 |
| JP | 11-168670 | 6/1999 |
| JP | 2003-149047 | 5/2003 |

OTHER PUBLICATIONS

Aaron J. Miller et al.; Applied Physics Letters, vol. 83, No. 4, pp. 791-793, Jul. 28, 2003. Discussed in the specification.
Japanese Office Action dated Oct. 18, 2006 (mailing date), issued in corresponding Japanese Patent Application No. 2003-272456.

* cited by examiner

*Primary Examiner*—Georgia Epps
*Assistant Examiner*—Kevin Wyatt
(74) *Attorney, Agent, or Firm*—Westerman, Hattori, Daniels & Adrian, LLP.

(57) ABSTRACT

This invention provides a method for manufacturing a circuit for photon number counting without destroying a FET within the circuit by manufacturing a photodetector for weak light, the photodetector for weak light comprising a circuit on a substrate, the circuit comprising light detection means and a field effect transistor (FET), the method comprising: a light detection means connection step; an FET electrode-to-substrate electrode connection step; an external electrode connection step, a light detection means-to-gate connection step.

17 Claims, 8 Drawing Sheets

METHOD FOR MANUFACTURING PHOTODETECTOR FOR WEAK LIGHT

BACKGROUND OF THE INVENTION

1. Field of the Invention

The present invention relates to a photodetector for weak light, and more specifically a photodetector for discriminating the number of photons present in an optical pulse in a 1.5 μm band.

2. Description of the Related Art

It is expected that optical communication and information processing technologies taking advantage of quantum properties such as quantum cryptography and quantum teleportation will further advance in the future. These technologies are expected to be introduced into the infrastructure of information and telecommunication technology. Considering the present affinity of quantum communication experiments for techniques for generating, controlling, and detecting a photon correlation pair using a light in a 1.5 μm band that is a fiber low loss wavelength band will be important for future communication. Detection of a single photon is a basic technique for such communication technologies. A photodetector for weak light capable of detecting a single photon is a device which is not only necessary for such communication technologies but also important for inspection of quantum optics phenomena other than communication purposes.

At present, the device which detects a light in the 1.5 μm band is a PIN photodiode or an avalanche photodiode mainly containing InGaAs. The detector used in actual experiments for quantum cryptographic key distribution is an APD in Geiger mode.

Required performances for the 1.5 μm band photodetector in a future quantum communication field, include: high quantum efficiency (80 percents or more), low error rate, high response rate, and capability for discriminating the number of photons. If the APD is used as the detector, it is difficult to satisfy these requirements. The reason is as follows. Since the APD in Geiger mode is intended to improve the sensitivity of the detector, the APD loses information on the number of photons at the peak value of the detector, and thus cannot discriminate the number of photons such as one photon or two photons. In addition, if the sensitivity of the APD is improved, the error rate is increased, accordingly. For example, if a dark count of 0.1 percent is allowed, the quantum efficiency of the APD in Geiger mode is about 32 percents.

In recent years, a photodetector capable of measuring the number of photons of light in a 1.5 μm band using a bolometer made of a superconductor has been developed (see Non-Patent Literature of A. J. Miller, S. Woo, J. M. Martinis, and A. V. Sergienko: "QCMC'02 (2002)"). This photodetector is required to be cooled down to 100 millikelvins (100 mK). In principle, the photodetector does not operate if it is not cooled to a deep cryogenic temperature. Therefore, it is considered difficult to utilize this photodetector for communication purposes. In addition, the photodetector has disadvantages such as low coupling efficiency with respect to a fiber, and low quantum efficiency, evaluated at 20 percent.

SUMMARY OF THE INVENTION

The photodetector and FET should be connected on the same substrate for a photodetector for weak light that utilizes a FET to work correctly. However, the photodetector for weak light utilizes a FET (e.g., GaAs J-FET) which is destroyed even by subtle heat or a low voltage. Thus, if a soldering operation is carried out while the gate electrode of the FET is connected to the light detection means, the gate electrode of the FET is destroyed even by the remaining heat of a solder or the like. Namely, with the conventional manufacturing method, it is difficult to manufacture the photodetector for weak light according to the present invention. Therefore, a means to manufacture the circuit for photon number detection without destroying the FET is desired.

To attain the above object, the present invention is characterized by the following method for manufacturing a photodetector for weak light: a gate electrode is connected to a ground state then photodetector means are connected to the gate electrode; and, then the gate electrode is removed from the ground. To manufacture a photodetector for weak light based on the above method requires more steps and becomes more complicated than the conventional manufacturing process. However, the method above manufactures a photodetector for weak light without losing the character of the FET.

According to a first aspect of the present invention, a method is provided for manufacturing a photodetector for weak light, the photodetector for weak light comprising a circuit on a substrate, the circuit comprising light detection means and a field effect transistor (FET), the method comprising:

a light detection means connection step for attaching the light detection means to the substrate, and connecting one end of an electrode of the light detection means to a first electrode provided on the peripheral portion of the substrate;

an FET electrode-to-substrate electrode connection step for connecting a gate electrode of the FET to a second electrode, which is provided on the substrate and is connected to a third electrode provided on the peripheral of the substrate, and for connecting a source electrode and a drain electrode of the FET to a fourth electrode and a fifth electrode provided on the peripheral of the substrate, respectively;

an external electrode connection step for connecting the first electrode connected to the light detection means and the third, the fourth, and the fifth electrodes, which are connected to the respective electrodes of the FET, and which are provided on the peripheral of the substrate, to an electrode on a connection port connectable to an external terminal outside of the photodetector for weak light;

a light detection means-to-gate connection step of connecting a sixth electrode, which is the electrode of the light detection means other than the first electrode, to the second electrode to which the gate electrode of the FET is connected; and a gate-external terminal disconnection step for disconnecting the second electrode, to which the sixth electrode of the light detection means and the gate electrode of the FET are connected, from the third electrode provided around the substrate.

According to the first aspect of the present invention, it is preferable that the elements, including a capacitor and a resistor, necessary to the circuit are connected after the light detection means-to-gate connection step, and before the gate-external terminal disconnection step.

It is also preferable that the light detection means is one of either a PIN photodiode or an avalanche photodiode (APD).

It is also preferable that the FET is a GaAs JFET.

It is also preferable that the circuit comprising the light detection means and the field effect transistor (FET) is an integrating read circuit.

It is also preferable that the circuit comprising the light detection means and the field effect transistor (FET) is one of either a capacitive trans-impedance amplifier (CTIA) circuit or a charge integrating amplifier (CIA) circuit.

IN the CTIA embodiment, it is also preferable that the circuit comprising the light detection means and the field effect transistor (FET) comprises:

the FET;

the light detection means connected to the gate electrode of the FET;

a capacitor connected to the gate electrode of the FET;

a resistor connected to the source electrode of the FET; and an operational amplifier connected to the source electrode of the FET.

It is also preferable that the capacity of the capacitor is 0.01 to 1 pico farad (pF).

It is also preferable that the capacitor has an area of 0.1 to 10 square millimeters ($mm^2$), and a thickness of 0.1 to 0.5 millimeter (mm).

It is also preferable that the dielectric that constitutes the capacitor contains quartz glass.

In the CIA embodiment, it is also preferable that the circuit comprising the light detection means and the field effect transistor (FET) comprises:

the FET;

the light detection means connected to the gate electrode of the FET;

a first resistor connected to the source electrode of the FET;

an operational amplifier connected to the source electrode of the FET through the first resistor; and a second resistor that connects a negative input terminal of the operational amplifier to an output terminal of the operational amplifier.

It is also preferable that the resistance value of the resistors is 100 kilo ohms (kΩ) to 30 mega ohms (MΩ).

The present invention as stated above needs more steps and becomes more complicated than the conventional way to manufacture. However, the present invention can manufacture a photodetector for weak light and detect systems without losing the character of the FET. Thus, the present invention is a frontier invention for developing new devices.

The present invention can provide a photodetector for weak light and a detection system with a high enough sensitivity to be able to measure the number of photons. The present invention can particularly provide a photodetector for weak light which sufficiently operates at temperatures as low as 4.2 kelvins (4.2 K). The previous photon number resolving photodetectors must be cooled to 100 millikelvins (100 mK). The photodetector for weak light according to the present invention, by contrast, can measure the number of photons in a temperature environment that can be obtained by cooling the device using only liquid helium. The photodetector for weak light according to the present invention is, therefore, applicable to various devices and easy to utilize. The photodetector for weak light according to the present invention does not use nonlinear amplification means. Therefore, the photodetector for weak light according to the present invention can measure the number of photons without losing information on the number of photons.

BRIEF DESCRIPTION OF THE DRAWINGS

FIGS. 3A and 3B are schematic diagrams which depict another embodiment of the weak light detection system according to the present invention, wherein FIG. 3A is a top view of the weak light detection system, and FIG. 3B is a cross-sectional view taken along a line A—A of FIG. 3A;

FIGS. 6A and 6B depict noise spectrums, wherein FIG. 6A depicts a noise spectrum if an ultraviolet transmittable substrate is used, and FIG. 6B depicts a noise spectrum of a substrate that does not transmit UV light;

FIGS. 7A to 7C are schematic diagram of a charge reset means according to the present invention, wherein FIG. 7A is a schematic diagram which depicts an example of the charge reset means which includes a rotation mechanism, FIG. 7B is a schematic diagram which depicts an example of the charge reset means which includes an ascent and descent mechanism, and FIG. 7C is a schematic diagram which depicts an example of the charge reset means which includes a diagonally provided ascent and descent mechanism.

DESCRIPTION OF THE PREFERRED
EMBODIMENTS OF THE INVENTION

Figure 1:
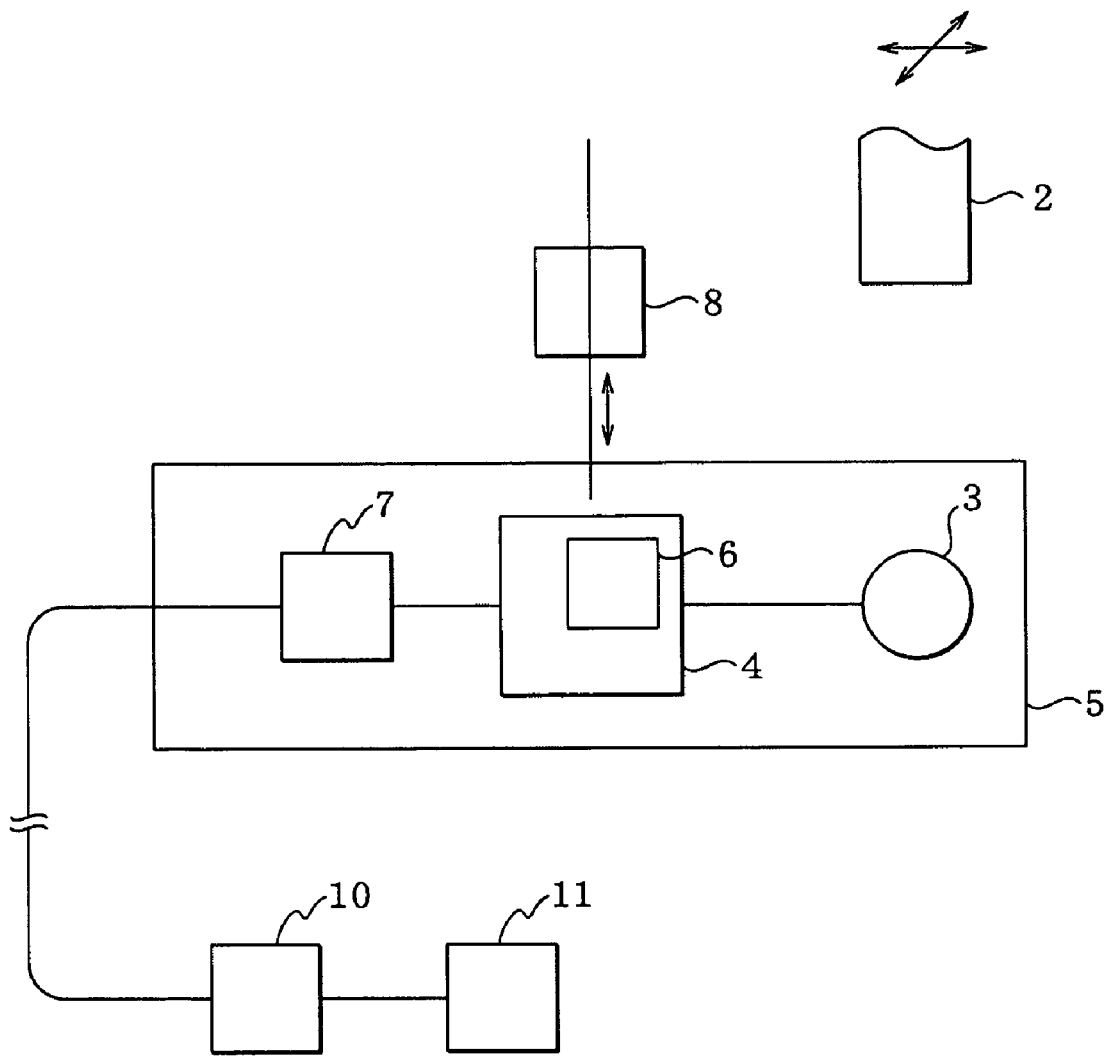
FIG. 1 is a block diagram of a weak light detection system according to the present invention.

A first embodiment of a photodetector for weak light will be described with reference to FIG. 1. As shown in FIG. 1, the photodetector for weak light includes a light detection means 3 which receives and detects a light from a light source 2, an integrating read circuit 4, and a substrate 5 on which the light detection means 3 and the integrating read circuit 4 are integrated. The integrating read circuit 4 preferably includes a field effect transistor (FET) 6. The photodetector for weak light according to the present invention may include an output means 7 which outputs a voltage or a current output from the integrating read circuit 4 to an outside of the substrate 5. The photodetector for weak light according to the present invention may include a charge reset means 8 which grounds the integrating read circuit.

Light Source

As the light source 2, any well-known light source may be applicable. An output portion of the light source 2 is preferably an optical fiber, more preferably a single mode optical fiber, most preferably a standard single mode optical fiber.

Light Detection Means

The light detection means is a means for detecting light. The light detection means 3 include photodetectors such as a PIN photodiode and an avalanche photodiode. The PIN photodiode is preferably an InGaAs PIN photodiode. Preferably, the APD in Geiger mode is not used. The light detection means 3 is preferably positioned in the center of the substrate 5.

Integrating Read Circuit

The integrating read circuit 4 is, for example, a circuit which detects a light by integrated charges of the optically pumped photodetector in a gate electrode of the FET 6, and measuring a voltage generated by integrating. As will be described later, examples of the integrating read circuit 4 include a capacitive trans-impedance amplifier (CTIA) circuit and a charge integrating amplifier (CIA) circuit. Examples of the integrating read circuit 4 according to the present invention include an integrating read circuit 4 that includes a FET 6.

Substrate

The substrate 5 utilizable for the photodetector for weak light according to the present invention is not limited as long as the substrate 5 can be equipped with the integrating read circuit 4 and allows the circuit 4 to function. Examples of the substrate 5 that are utilizable for the photodetector for weak light according to the present invention include ultraviolet (UV) transmittable substrates such as substrate consisting of calcium fluoride ($CaF_2$), silicon dioxide, quartz glass (a-$SiO_2$), crystallized quartz (crystal quartz), sapphire, aluminum oxide, magnesium oxide, lithium niobate ($LiNbO_3$), strontium titanate ($SrTiO_3$), magnesium fluoride ($MgF_2$), potassium bromide (KBr), and fluororesin. The reason for the use of the UV transparent substrate is to reduce noise deriving from dielectric polarization. By using the UV transparent substrate, even if the substrate 5 is cooled cryogenically to about 4.2 K, breakage of a wiring pattern can be prevented. The substrate 5 that constitutes the photodetector for weak light according to the present invention preferably has a high purity. A molar concentration of the substrate 5 is preferably 99.99 percents or more, more preferably 99.999 percents or more, far more preferably 99.9999 percents or more, most preferably 99.99999 percents or more.

A shape of the substrate 5 is not limited to a specific one. The substrate 5 is normally flat rectangular, preferably flat square. As a size of the substrate 5, a length of one side is, for example, 5 to 30 millimeters, preferably 10 to 20 millimeters, more preferably 12 to 18 millimeters, most preferably 15 millimeters. An area of the substrate 5 is preferably 25 to 900 $mm^2$, more preferably 100 to 400 $mm^2$, far more preferably 150 to 300 $mm^2$, most preferably 225 $mm^2$. If the substrate 5 is too small in size, then the light detection means 3, the integrating read circuit 4, and the like cannot be mounted on the substrate 5, and it is difficult to manufacture the photodetector for weak light. If the substrate 5 is too large, the photodetector is made large, accordingly. Electrodes are formed on the substrate 5 by, for example, photolithography.

Output Means

The output means is a means for outputting the output of the photodetector for weak light. The output means 7 utilizable for the photodetector for weak light according to the present invention is not limited as long as the output means 7 can transmit the output of the photodetector for weak light to the weak light detection system. Examples of the output means 7 include a copper wire that connects the photodetector for weak light to the outside, and an amplifier.

Weak Light Detection System

Examples of the weak light detection system 9 according to the present invention include the weak light detection system which includes the photodetector for weak light, and which also includes a conversion means 10 for converting information output from the output means 7 into information on the number of photons or the like, and a display means 11 for displaying the information on the number of photons obtained by the conversion means 10.

Conversion Means

The conversion means is a means for decoding the voltage or the like output from the photodetector for weak light to information on the number of photons. The conversion means 10 in the weak light detection system according to the present invention is not limited as long as the conversion means 10 can decode the voltage or the like output from the photodetector for weak light to information on the number of photons.

Display Means

The display means is a means for displaying the information on the number of photons detected by the photodetector for weak light. The display means 11 in the weak light detection system according to the present invention is not limited as long as the display means 11 can display the information on the number of photons detected by the photodetector for weak light. For examples, a well-known display means such as an oscilloscope, a computer display, or a CRT can be used as the display means 11.

Function of Weak Light Detection System

In the weak light detection system according to the present invention, the light detection means 3 first detects a light emitted from the light source 2. Information on the light detected by the light detection means 3 is converted into, for example, voltage information by the integrating read circuit 4. The information on the light converted into the voltage or the like is output by the output means 7. The voltage output by the output means 7 is converted into information on the number of photons or the like by the conversion means 10 in the weak light detection system according to the present invention. The information on the number of photons or the like converted from the voltage by the conversion means 10 is displayed on the display means 11 such as a display.

Example of the System

Figure 2:
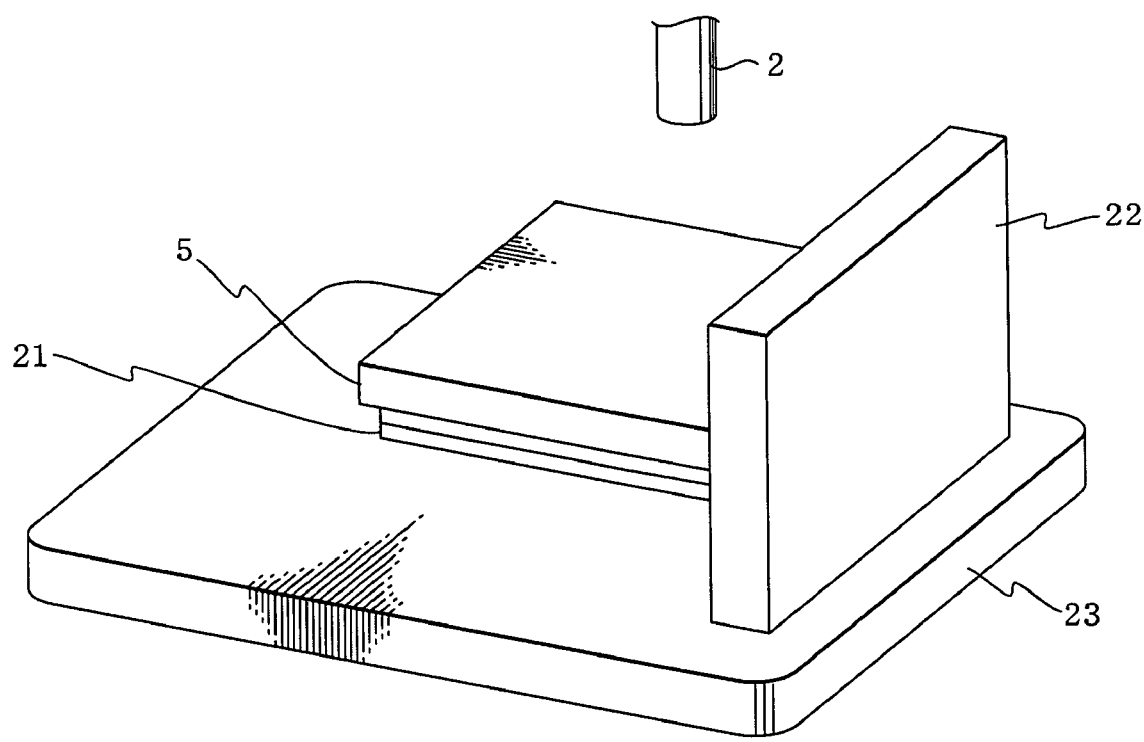
FIG. 2 is a schematic diagram which depicts an embodiment of the weak light detection system according to the present invention.

FIG. 2 depicts one example of the weak light detection system according to the present invention. As shown in FIG. 2, the weak light detection system includes the substrate 5, on which the light detection means 3, the integrating read circuit 4, and the like are mounted, a substrate support section 21 which supports the substrate 5, a support column 22 which supports the substrate support section 21 so as to facilitate the substrate support section 21 to move in parallel, and a work surface 23 which supports the support column 22. Such a weak light detection system can adjust a position of the light detection means 3 on the substrate 5, and can arrange the light detection means 3 at an appropriate position.

In such a weak light detection system, the work surface 23 is preferably distant from the substrate 5. A distance between the work surface 23 and the substrate 5 is preferably 1 millimeter or more, more preferably 3 millimeters or more, far more preferably 5 millimeters or more, most preferably 1 centimeter or more. The reason is as follows. The substrate 5 and the work surface 23 constitute one capacitor. If the distance between the substrate 5 and the work surface 23 that constitute the capacitor is smaller, more charges are accumulated at a lower voltage. According to the present invention, a FET 6 which is damaged even by very small charges is preferably used. Therefore, it is preferable not to accumulate more charges.

The shape of the substrate support section 21 is not limited as long as the substrate support section 21 can mount the substrate 5 thereon. Preferably, the substrate support section 21 is composed by two convex portions and mounts the substrate 5 thereon at the two convex portions. This is because it is preferable that a contact portion between the substrate 5 and the substrate support section 21 is smaller. Examples of the convex portion include a prism shorter than the length of the substrate 5 to be mounted.

The weak light detection system according to this embodiment includes, for example, an input device which inputs an instruction for moving the substrate support section 21, a converter which converts the instruction for moving the substrate support section 21 input to the input device into electrical information, a transmission means for transmitting the information converted from the instruction by the converter to an instruction section, and an actuator which moves the substrate support section 21 horizontally based on the information transmitted from the transmission means to the instruction section. Namely, according to this weak light detection system, the instruction for moving the substrate support section 21 input to the input device is converted into electrical information by the converter, the electric information is transmitted to the instruction section by the transmitting means, and the instruction section issues an instruction to the actuator, thereby moving the substrate support section 21 horizontally. In other words, the weak light detection system can adjust the position of the substrate 5 by inputting positional information to the input means. According to another preferable embodiment of the present invention, the substrate support section 21 is vertically movable.

According to another preferable embodiment of the present invention, the substrate 5 is fixed, and the light source 2 is movable in, for example, a horizontal direction by light source moving means. Examples of the light source moving means include means which grips the light source 2, and which can move the light source 2 according to input information from the input means using an actuator or the like. The movable substrate is not always desirable for the following reason. If the substrate 5 is movable, a member that generates an electric field is undesirably located near the substrate 5.

Figure 3A:
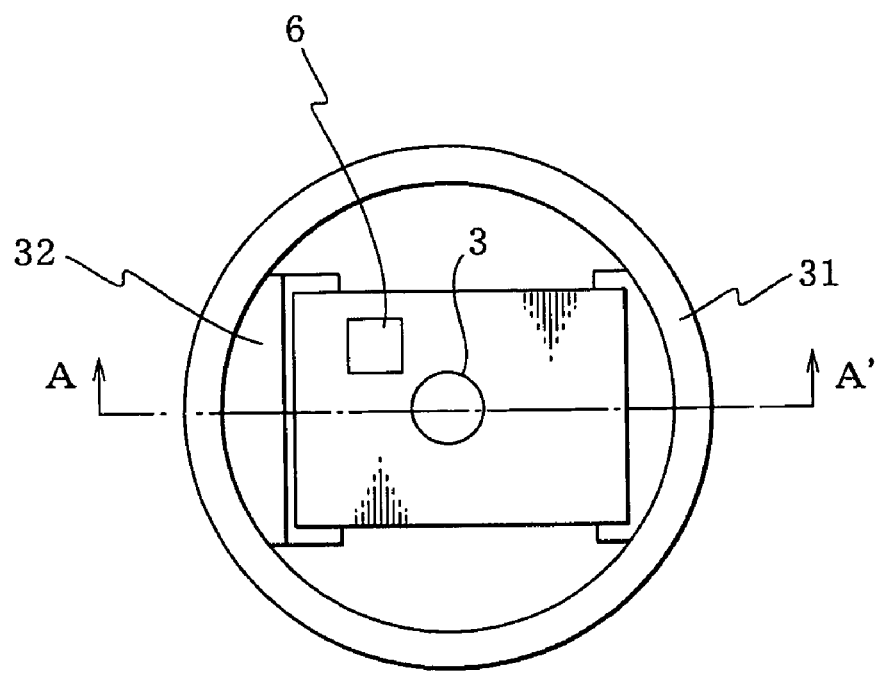
Figure 3B:
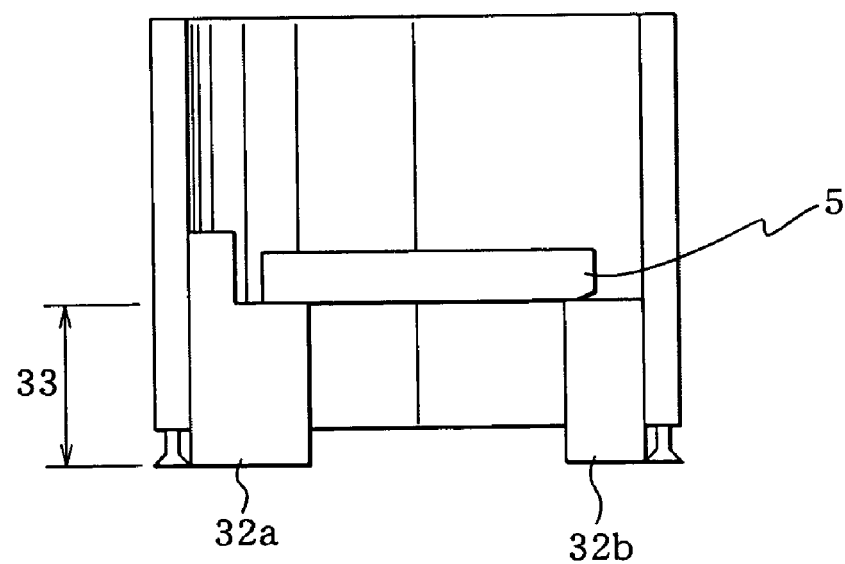

FIG. 3 depicts another embodiment of the weak light detection system according to the present invention. FIG. 3A is a top view of the system, and FIG. 3B is a cross-sectional view taken along ling A–A' of FIG. 3A. As shown in FIG. 3A, this weak light detection system includes a jacket 31 provided to be substantially concentric with the light detection means 3, and a substrate support section 32 provided in the jacket 31, and mounted on the substrate support section 32a the substrate 5. The substrate 5 is deformed by thermal expansion. If the substrate is deformed, the position of the light detection means 3 is disadvantageously shifted from an optical axis. However, by using this jacket 31 and providing the light detection means 3 at the center of the jacket 31, the deformation of the substrate 5 caused by thermal expansion can be made isotropic from the light detection means 3, thereby making it possible to reduce the amount of shift in the light detection means 3.

Examples of a material of the jacket 31 include aluminum, brass, copper (e.g., pure copper), gold, silver, iron, and alloys thereof. The material of the jacket 31 is preferably aluminum, brass, or copper (e.g., pure copper), more preferably aluminum or pure copper. Since the jacket 31 preferably, satisfactorily conducts heat to the chamber that surrounds the photodetector for weak light, a material having an excellent heat conductivity is preferably used as the material of the jacket 31. In addition, since the jacket 31 is formed into a cylindrical shape or the like, a material having a high workability is preferably used as the material of the jacket 31.

Examples of the jacket 31 include a cylindrical jacket. The size of the jacket 31 is not limited as long as the jacket 31 can contain therein the substrate 5. However, if the jacket 31 is too large, it is difficult to cool the substrate 5. The outside diameter of the jacket 31 is, therefore, preferably 10 millimeters to 50 centimeters, more preferably 15 millimeters to 10 centimeters, far more preferably 25 to 50 millimeters, most preferably 30 millimeters.

As shown in FIGS. 3A and 3B, the substrate support section 32 is preferably divided into two portions 32a and 32b so that the two portions 32a and 32b are equal in height and thereby hold the substrate 5 substantially parallel. It is preferable that the substrate 5 is put at a high position to some extent for the same reason as that stated above. For the stability of the substrate 5, at least a part of the substrate support section 32 preferably includes a stepped portion (32a).

The height 33 of the substrate support section 32 at which the substrate support section 32 supports the substrate (e.g., the height from the work surface, which extends horizontally and in which the support column is buried, to the substrate 5) is preferably 1 millimeter or more and 10 centimeters or less, more preferably 3 millimeters or more and 5 centimeters or less, far more preferably 5 millimeters or more and 3 centimeters or less, most preferably eight millimeters.

At least a part of the substrate support section 32 preferably includes the stepped portion. This stepped portion enables stable holding of the substrate 5. The height of the stepped portion 32b is not limited. Preferably, the height of the stepped portion 32b is 1 millimeter to 1 centimeter, more preferably 2 millimeters.

According to another embodiment of the present invention, the substrate 5 is fixed and the light source 2 can be moved in, for example, the horizontal direction by the light source moving means. Examples of the light source moving means include means which grip the light source 2, and which can move the light source 2 according to input information from the input means using an actuator or the like. The movable substrate is not always desirable for the following reason. If the substrate 5 is movable, a member that generates an electrical field is disadvantageously located near the substrate 3. According to another preferred embodiment, the light source 2 can be moved by the same mechanism for moving the substrate support section 32 already stated above.

Operation Description of Integrating Read Circuit

Figure 4:
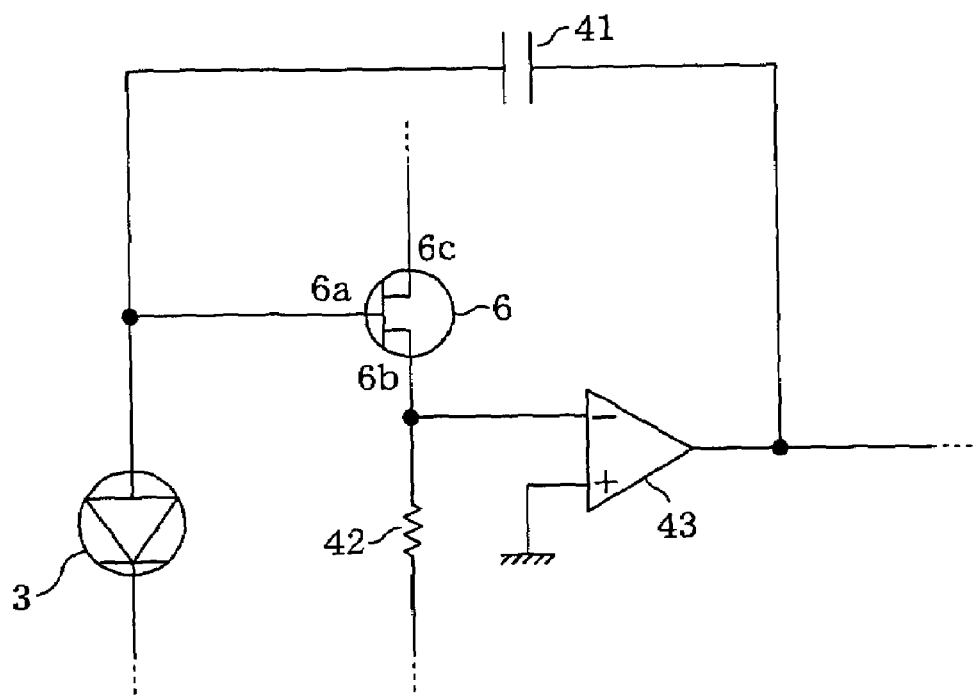
FIG. 4 is a block diagram of a CTIA circuit according to the present invention.

The integrating read circuit 4 according to the present invention detects a light by accumulating optically pumped charges in a feedback capacitor or a gate of an amplifier provided in a first stage of the circuit 4, and measuring a generated voltage. FIG. 4 is a circuit diagram which depicts an example of the integrating read circuit 4 that includes the CTIA, which is one constituent element of the integrating read circuit 4 according to the present invention.

CTIA Circuit

As shown in FIG. 4, examples of the integrating read circuit 4 that includes the CTIA circuit according to the present invention include the integrating read circuit 4 which includes the FET 6, the light detection means 3 connected to the gate electrode 6a of the FET, a capacitor 41 connected to the gate electrode 6a of the FET, a resistor 42 connected to a source 6b of the FET 6, and an operational amplifier 43 connected to a source electrode 6b of the FET 6. One end (a positive input terminal) of the operational amplifier 43 is grounded. An output terminal of the operational amplifier 43 is connected to one end of the capacitor 41, and a voltage is output from the circuit 4.

Field Effect Transistor (FET)

As the FET 6, a well-known FET operable at a low temperature can be used. The FET 6 is a kind of transistor called a "field effect transistor". Types of FET 6 are classified as either a junction FET or a MOS FET according to its structure, and further classified as either a P channel FET or an N channel FET corresponding to PNP and NPN transistors, respectively.

According to the present invention, the FET 6 is preferably a junction FET, more preferably the junction FET using GaAs (hereinafter, "GaAs J-FET"). The GaAs J-FET performs a transistor operation at a temperature of 4.2 K or less, and is characteristically low in capacitance and low in leakage current. Therefore, the GaAs J-FET is effective in the high sensitivity, high resistance photodetector that operates cryogenically. Specifically, a GaAs J-FET manufactured by Sony Corporation can be used.

Capacitor

The capacitance of the capacitor 41 is adjusted according to a quantity of incident light. The capacitance of the capacitor 41 is preferably 0.01 to 1 picofarad (pF).

The capacitor 41 which does not generate additional noise such as a dielectric polarization noise is preferably used. Since the photodetector for weak light according to the present invention operates cryogenically, the capacitor 41 is preferably small in fluctuation of capacitance relative to temperature change, and excellent in operational stability at cryogenic temperatures. In addition, the capacitor 41 preferably does not cause a leakage field or a leakage current. From these viewpoints, a dielectric that constitutes the capacitor 41 has an area of preferably 0.1 to 10 mm$^2$, more preferably 0.4 to 5 mm$^2$, far more preferably 0.8 to 4 mm$^2$, most preferably 1 mm$^2$. The dielectric that constitutes the capacitor 41 has a thickness of preferably 0.1 to 0.5 millimeter, more preferably 0.2 to 0.4 millimeter, most preferably 0.3 millimeter. The material of the dielectric is preferably a UV transparent material such as high purity quartz glass. By using such a UV transparent material, a capacitor 41 capable of suppressing the dielectric polarization noise can be obtained. The electrode of the capacitor 41 is preferably a high strength conductive adhesive. Namely, by using a high strength conductive adhesive as the electrode, occurrence of the noise on an interface can be avoided.

More specifically, the capacitor 41 having high purity quartz glass, which has an electrode surface of 1 millimeter by 1 millimeter, and which has a thickness of 0.3 millimeter, coated with a high strength conductive adhesive is used. The capacitance of this capacitor 41 is 0.03 pico farad.

Resistance

A well-known resistor can be used as the resistor 42. The resistor 42 has a resistance value of preferably 100 kilo ohms to 30 mega ohms, more preferably 5 to 15 mega ohms, far more preferably eight to 12 mega ohms, most preferably 10 mega ohms. According to the present invention, a resistor 42 having such a high resistance value is used.

Operational Amplifier

A well-known operational amplifier can be used as the operational amplifier 43 according to the present invention.

The operational amplifier 43 is preferably a low noise amplifier. Specifically, a low noise amplifier manufactured by Analog Devices such as "OP27" (product name) can be used as the operational amplifier 43.

Operation of CTIA Circuit

The light detection means 3 receives a light. Then, the light detection means 3 outputs electrons pumped by photons. The output electrons are accumulated in the gate electrode 6a of the FET 6. A voltage with a gate voltage rise $V_{out}$ according to the following Equation 1 is output from the operational amplifier 43.

Equation 1:

$$V_{out} = -\frac{Q}{C_f}$$

In the Equations, Q denotes generated charges, GM denotes a source follower gain, and $C_f$ denotes a feedback capacitance.

An output noise can be expressed by the following Equation 2.

Equation 2:

$$Noise_{out} = -\frac{(C_{input} + C_f)V_{noise}}{GMC_f}$$

In the equation, $C_{input}$ denotes a gate input capacitance+ a floating capacitance, and $V_{noise}$ denotes channel noise of the FET 6. Accordingly, an S/N ratio of the system is expressed by the following Equation 3.

Equation 3:

$$\therefore S/N = \frac{GMQ}{(C_{input} + C_f)V_{noise}}$$

Charge release is carried out preferably before an output voltage is saturated. To release charges, a reset FET or the charge reset means to be described later may be used.

In the weak light detection system according to the present invention, a factor that determines the S/N ratio is the output voltage of the FET 6. The ratio of voltage at which a single electron is generated to noise characteristic of the FET 6 determines whether the single electron can be counted. It is important, therefore, to reduce the noise of the FET 6 for the system according to the present invention.

As will be described later, according to the present invention, the photodetector for weak light is cooled to a low temperature such as 4.2 K by, for example, a cryostat, thereby making it possible to reduce the noise. If the temperature is about 4.2 K, the photodetector can be cooled relatively easily by using liquid helium or the like. A well-known cryostat can be used as the cryostat. The cryostat preferably cools the photodetector by liquid helium. By cooling the photodetector for weak light to 4.2 K, the following advantages can be obtained: reduction of thermal noise, reduction of hopping current, reduction of dielectric polarization noise, and reduction of the gate leakage current of the FET 6. The thermal noise power is proportional to an element temperature. Therefore, the lower the temperature of the photodetector, the lower the noise. A mobility of the hopping current which may possibly be a dark current of the detector is proportional to exp(–U/kT) (U: barrier height). Therefore, the lower the temperature of the photodetector, the lower the hopping current. The dielectric polarization noise is expressed by the following Equation 4.

$$I_n^2 = 4\,kT\omega C''$$

$$V_n^2 = I_n^2/(\omega C_f)^2 \qquad \text{Equation 4:}$$

In Equation 4, $\omega$ denotes an angular frequency and $C''$ denotes a complex component of the capacitance.

The dielectric polarization noise corresponds to a fluctuation of a dielectric loss. Equation 3 indicates that the dielectric polarization noise can be reduced by decreasing the element temperature, and by selecting a matter having a low dielectric loss. The gate leakage current of the FET 6 can be explained by the same physical process as that of the hopping current.

(CIA Circuit)

Figure 5:
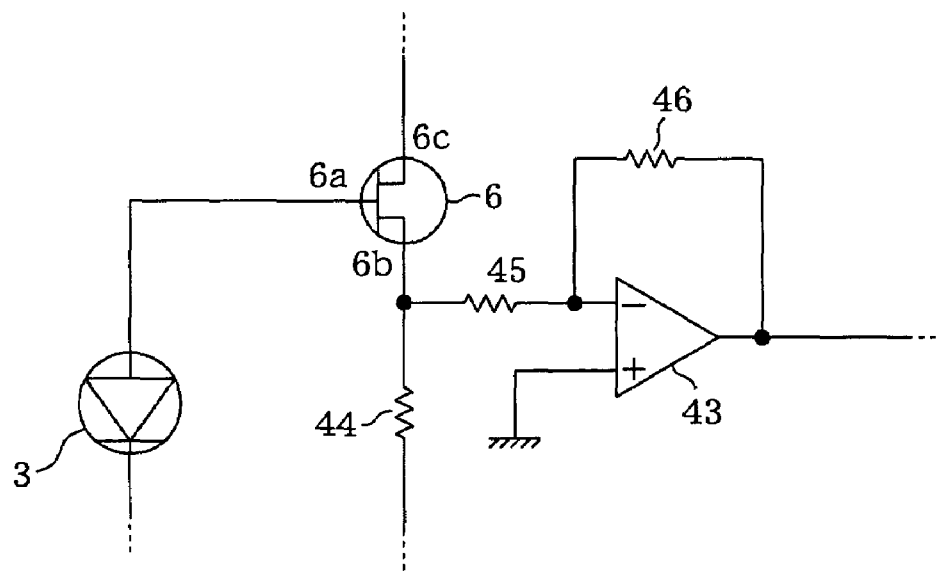
FIG. 5 is a block diagram of a CTA circuit according to the present invention.

As shown in FIG. 5, examples of the integrating read circuit 4, that includes the CIA according to the present invention, include the integrating read current which includes the FET 6, the light detection means 3 connected to the gate electrode 6a of the FET 6, a resistor 44 connected to the source electrode 6b of the FET 6, the operational amplifier 43 connected to the source electrode 6b of the FET 6 through the resistor 45, and a resistor 46 which connects a negative input terminal of the operational amplifier 43 to an output terminal thereof. One end (the positive input terminal) of the operational amplifier 43 is grounded. A voltage is output from the output terminal of the operational amplifier 43. Since the same constituent elements of the CIA circuit as those of the CTIA circuit can be used, they will not be described herein.

Output and the Like of CIA Circuit

The output and the like of the CIA circuit are expressed by the following Equation 5.

Equation 5:

$$V_{out} = -GM\frac{Q}{C_{input}}$$

$$Noise_{out} = -V_{noise}, \text{ and}$$

$$\therefore S/N = \frac{GMQ}{C_{input}V_{noise}}$$

In Equation 5, Q denotes generated electric charges, $V_{noise}$ denotes the channel noise of the FET 6, GM denotes a source follower gain, $C_{input}$ denotes a gate input capacitance+ a floating capacitance, and $C_f$ denotes a feedback capacitance.

Preferable Example of Substrate and Verification Thereof

As a method for measuring impurities in the dielectric, a fluorescence analysis method is known. If the dielectric transmits ultraviolet rays, this means that a concentration of impurities contained in the dielectric is low. If impurities are mixed into the dielectric, noise such as the dielectric polarization noise occurs and the noise adversely influences the weak light detection system. Preferably, therefore, a UV transparent substrate is used as the substrate 5 that constitutes the photodetector for weak light.

Figure 6A:
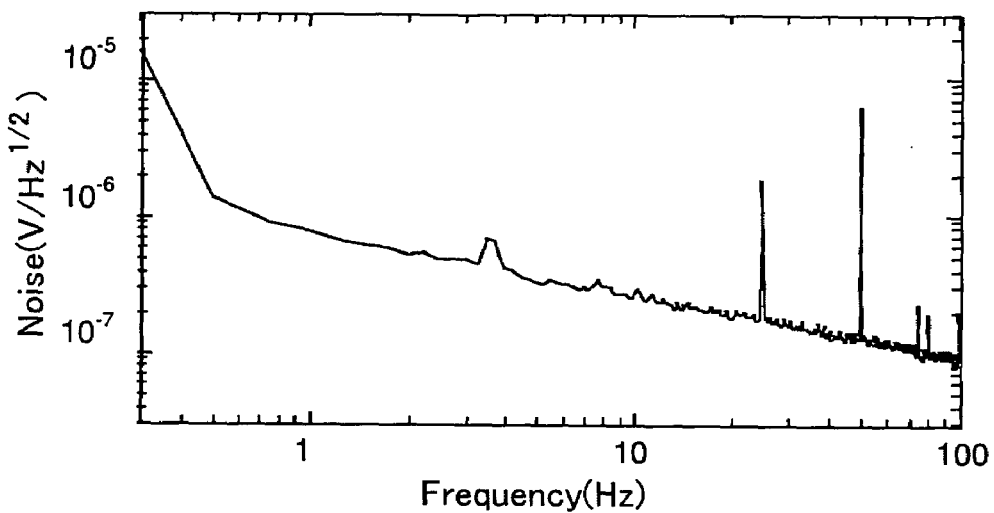
Figure 6B:
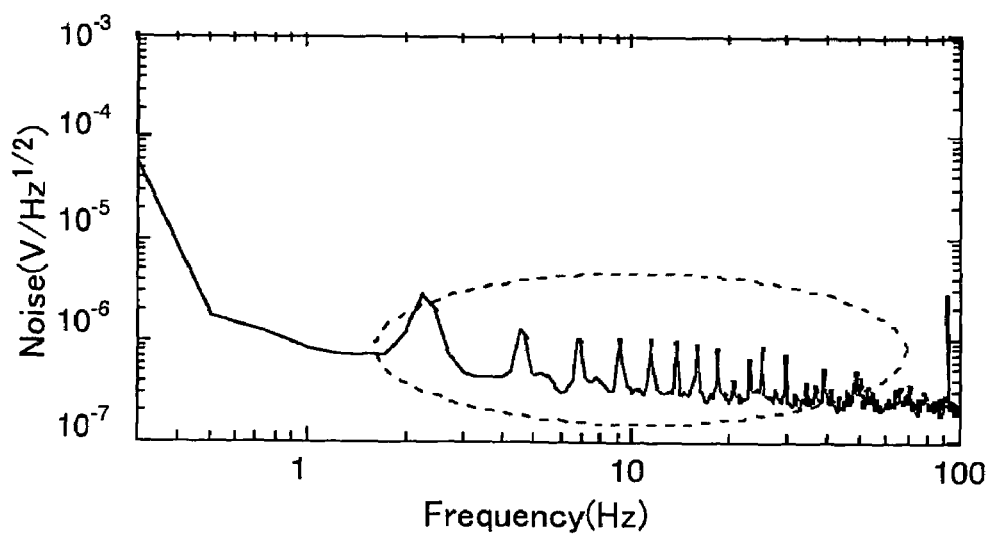

FIG. 6A depicts a noise spectrum if the UV transparent substrate is used, and FIG. 6B depicts a noise spectrum if the UV transparent substrate is not used. The noise is measured by R9211BFET Servo-Analyzer manufactured by Advantest Corporation. The system shown in FIGS. 3A and 3B is used as the weak light detection system during the measurement of the noise spectrum. The comparison between FIGS. 6A and 6B shows that if the UV transparent substrate is not used, many noises resulting from impurities are observed in a frequency region of about-2 to 70 hertz. This indicates that the UV transparent substrate is preferably included in the photodetector for weak light.

Charge Reset Means

While the integrating read circuit 4 operates accurately, electrical charges can be accumulated in the circuit 4. However, if the charges are continuously accumulated, the output of the circuit 4 is saturated and the circuit 4 cannot detect the signal light. Before this state occurs, it is necessary to release the accumulated charges from the circuit 4. To this end, a reset transistor is normally incorporated in the circuit 4. The reset transistor returns the charges in the integrating read circuit 4 to a ground level or a certain level. However, if the reset transistor is incorporated in the integrating read circuit 4, the input capacitance of the circuit 4 is increased. If the input capacitance is increased, the accuracy of the output signal of the circuit 4 is deteriorated and thus the performance of the photodetector is deteriorated.

According to the present invention, therefore, it is preferable to release the accumulated charges from the integrating read circuit 4 without using a reset transistor. Namely, the charge reset means, e.g., a mechanical switch, releases the charges from the integrating read circuit 4 by physically contacting a probe of the mechanical switch with the circuit 4 if the charges are accumulated in the circuit 4. If charges are to be accumulated in the circuit 4, the probe of the mechanical switch is physically separated from the circuit 4 by, for example, 1 millimeter or more. By doing so, the influence of the mechanical switch on the input capacitance of the circuit 4 can be lessened to an ignorable level. If a distance between the circuit 4 and the probe of the mechanical switch is wider, the influence of the mechanical switch on the input capacitance is smaller. Therefore, the distance between the integrating read circuit 4 and the probe is preferably 1 millimeter or more, more preferably 1.5 millimeters or more, most preferably 2 millimeters or more.

The charge reset means according to the present invention is connected to the integrating read circuit 4 when the charges are to be released, and thereby the charge reset means releases the charges accumulated in the circuit 4. Once the release of the charges is finished, the charge reset means can be separated farther from the circuit 4. The mounting capacity can be thereby reduced.

Figure 7A:
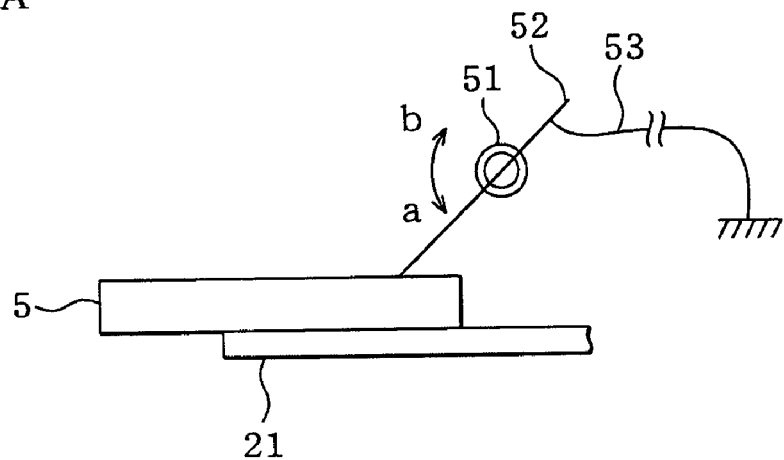
Figure 7B:
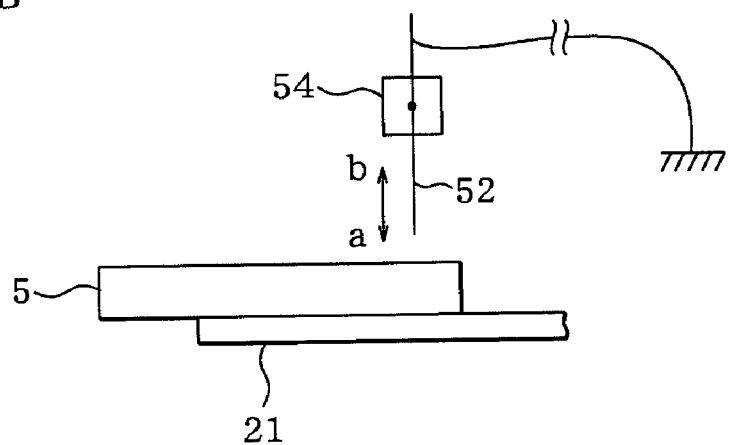
Figure 7C:
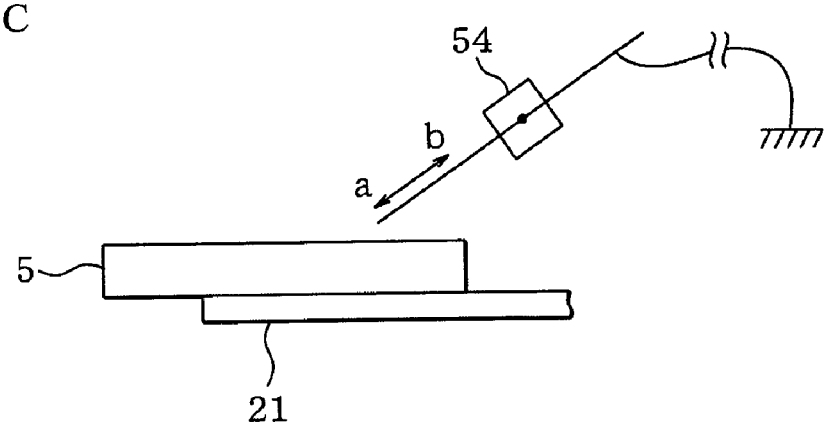

FIGS. 7A to 7C depict examples of the charge reset means according to the present invention. The charge reset means is not limited as long as the charge reset means can contact with the integrating read circuit 4, drop the voltage of the circuit 4 to the ground level or the certain level, and thereby release the charges from the circuit 4. A well-known charge reset means can be used.

FIG. 7A depicts an example of the charge reset means which includes a rotation mechanism. As shown in FIG. 7A, this charge reset means includes the rotation mechanism 51, a probe 52 rotated when the rotation mechanism 51 rotates, and a connection section 53 which connects the probe 52 to the outside and which consists of a copper wire or the like. If an instruction for releasing the charges from the circuit 4 is transmitted from the outside, then the rotation mechanism 51 rotates in a direction "a" shown in FIG. 7A, and the probe 52 comes in contact with the circuit 4 on the substrate 5.

When the probe 52 contacts with the circuit 4, the charges accumulated in the circuit 4 are released to the outside through the probe 52 and the connection section 53. If an instruction for separating the probe 52 from the circuit 4 is transmitted, the rotation mechanism 51 rotates in a direction "b" shown in FIG. 7A. The probe which has been in contact with the circuit 4 is separated from the circuit 4, accordingly. The contact and separation of the probe 52 may be carried out in response to an input from an external input device, automatically according to the amount of charges accumulated in the circuit 4, or at predetermined time intervals.

FIG. 7B depicts another example of the charge reset means which includes an ascent and descent mechanism. As shown in FIG. 7B, this charge reset means includes a ascent and descent mechanism 55, a probe 52 caused to rise and fall by the ascent and descent mechanism 55, and a connection section 53 which connects the probe 52 to the outside, and which consists of the copper wire or the like. If an instruction for releasing the charges from the circuit 4 is transmitted from the outside, then the ascent and descent mechanism 54 operates to cause the probe 52 to fall in a direction "a" shown in FIG. 7B, and the probe 52 comes in contact with the circuit 4 on the substrate 5. When the probe 52 contacts with the circuit 4, the charges accumulated in the circuit 4 are released to the outside through the probe 52 and the connection section 53. If an instruction for separating the probe 52 from the circuit 4 is transmitted, the ascent and descent mechanism 54 operates to cause the probe 52 to rise in a direction "b" shown in FIG. 7B. The probe 52 which has been in contact with the circuit 4 is separated from the circuit 4, accordingly. The contact and separation of the probe 52 may be carried out in response to the input from the external input device, automatically according to the amount of charges accumulated in the circuit 4, or at predetermined time intervals.

FIG. 7C depicts yet another example of the charge reset means which includes a diagonally provided ascent and descent mechanism 54. Differently from FIG. 7B, it is unnecessary to provide this ascent and descent mechanism 54 vertically. The ascent and descent mechanism 54 may be provided diagonally. It is preferable to diagonally provide the mechanism 54 since the mechanism 54 and the charge reset means can be distanced from the circuit 4.

Manufacturing Method

Figure 8:
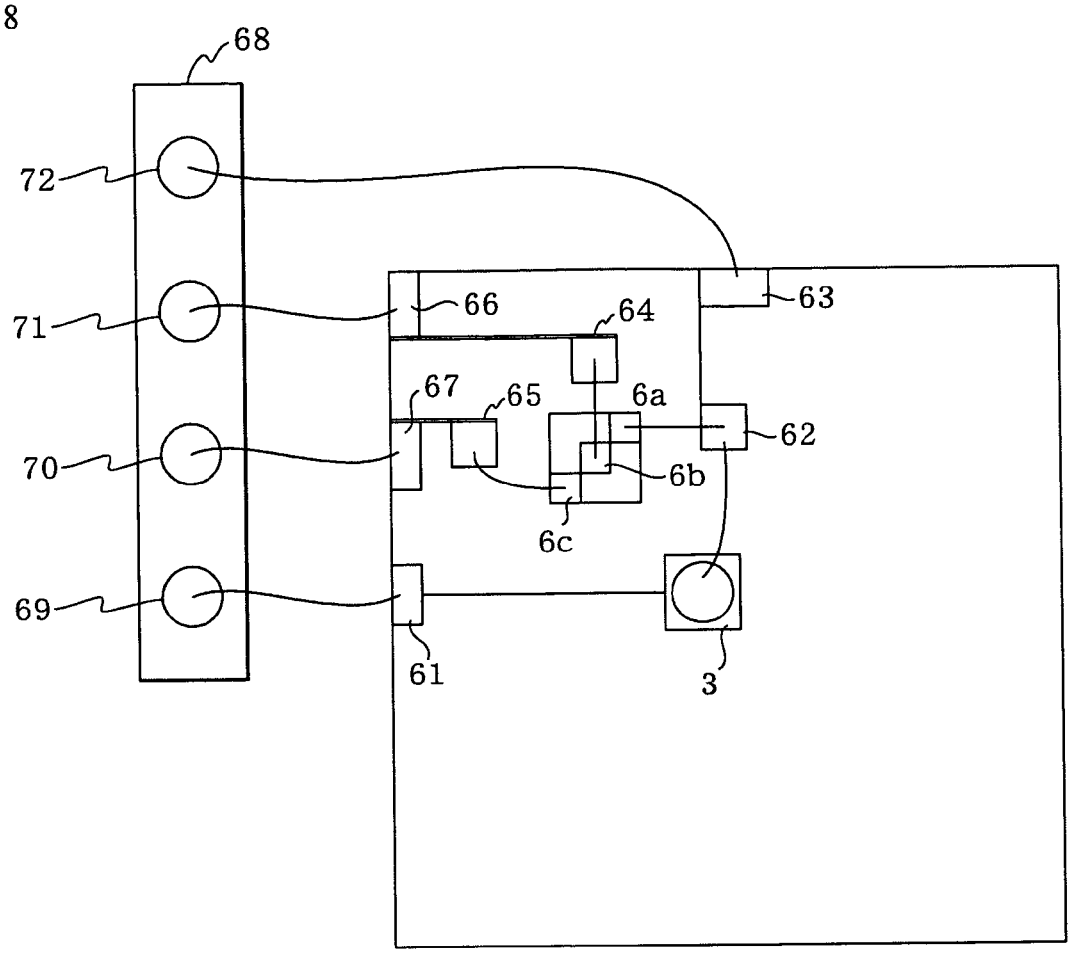
FIG. 8 is a schematic diagram for explaining manufacturing steps according to the present invention.

It is necessary to connect the light detection means 3 to the FET 6 so that the photodetector for weak light operates. However, the photodetector for weak light includes the FET (e.g., GaAs J-FET) 6 which is destroyed even by a low serge voltage. Therefore, if a soldering operation is carried out while the gate electrode 6a of the FET 6 is connected to the light detection means 3, the gate electrode 6a of the FET 6 is destroyed even by the remaining heat of a solder or the like. Namely, with the conventional manufacturing method, it is difficult to manufacture the photodetector for weak light according to the present invention. A manufacturing method capable of manufacturing the photodetector for weak light without destroying the FET 6 is desired. The destruction of the FET can be prevented by executing the following steps. The manufacturing method will be described with reference to FIG. 8.

Light Detection Means Connection Step

Electrodes 61 to 67 are provided in peripheral portions of the substrate 5 and portions slightly away from the center of the substrate 5, respectively. A connection port 68 for connecting the photodetector for weak light to an external device is prepared. The light detection means 3 such as the APD is attached first to the substrate 5, and one end of an electrode of the light detection means 3 is connected to the electrode 61 provided in the peripheral portion of the substrate 5 (a light detection means connection step).

FET Electrode-to-Substrate Electrode Connection Step

The respective electrodes of the FET 6 are connected to the electrodes on the substrates 5 (in an FET electrode-to-substrate electrode connection step). In this FET electrode-to-substrate electrode connection step, the gate electrode 6a of the FET 6 is connected through electrode 62 to the electrode 63 provided in the peripheral portion of the substrate 5 by a copper wire or the like. The source electrode 6b and the drain electrode 6c of the FET 6 are connected to, for example, the electrodes 66 and 67 provided in the peripheral portions of the substrate 5 through the electrodes 64 and 65 provided on the substrate 5, respectively.

External Electrode Connection Step

The electrode 61 connected to one of the electrodes of the light detection means 3, and the electrodes 63, 66 and 67, which are connected to the electrodes of the FET 6, and which are provided in the peripheral portions of the substrate 5, are connected to electrodes 69 to 72 on the connection port 68 which is connectable to external terminals provided outside of the photodetector for weak light, respectively (external electrode connection step). It is noted that when the photodetector for weak light operates, the photodetector is normally cooled to about 4.2 K, but the connection port 68 is connected to, for example, electrodes at a room temperatures.

Light Detection Means-to-Gate Connection Step

The electrode of the light detection means 3 such as the APD is connected to the electrode 62 to which the gate electrode 6a of the FET 6 is connected (light detection means-to-gate connection step). Small charges generated at this time are released to the outside through the electrode 63. It is thereby possible to prevent the destruction of the FET 6. Preferably, after this light detection means-to-gate connection step is executed, and before the next step is started, necessary elements such as the capacitor and the resistor for the integrating read circuit 4 are connected.

Gate-from-External Terminal Disconnection Step

The electrode 62, to which the electrode of the light detection means 3 and the gate electrode 6a of the FET 6 are connected, is disconnected from the electrode 63 provided in the peripheral portion of the substrate 5 (in a gate-from-external terminal disconnection step). The manufacturing of the photodetector for weak light according to the present invention is thus completed.

With this manufacturing method, the number of steps increases, as compared with the conventional manufacturing method. However, since the FET 6 is connected to the light detection means 3 in an environment in which electric and thermal influences are eliminated, the photodetector for weak light according to the present invention can be manufactured without damaging the FET 6.

According to the present invention, 500 nV√Hz@1 Hz is realized even under conditions in which the GaAs J-FET is used and the dielectric polarization noise is generated. A response rate is 100 kilohertz. Even at a gate input capacitance of 0.1 picofarad, if a single electron is input, an output of 1600 nanovolts is obtained (see M. Fujiwara, M. Sasaki, and M. Akiba: "Appl. Phys. Lett.", vol. 80, No. 10, 2002). Namely, an integrating read circuit 4 which has a S/N ratio of one or more in response to the input of a single electron can be constructed. The gate leakage current of the GaAs J-FET is three electrons per second.

A number-of-photons discriminator is provided in a liquid helium cryostat. An optical system in which a single mode fiber is combined with a lens (a focal length of 4 millimeters, a condensed light diameter of 20 micrometers) introduces a signal light to the photodetector for weak light. This single mode fiber is fixed to be positioned just on the photodetector for weak light by a fixing tool. The photodetector for weak light is arranged on a calcium fluoride substrate. The photodetector for weak light is manufactured as follows. A GaAs J-FET (D-mode, a junction width of 5 micrometers, and a junction length of 50 micrometers) for an InGaAs PIN photodiode (a light reception diameter of 30 micrometers) is fixed onto the calcium fluoride substrate patterned by Au and Cr, using a conductive paste. Respective element pads are connected to patterned electrodes by metal wires each having a diameter of 25 micrometers. The substrate is formed as an XY stage through a frame fixing tool. The substrate is mounted to be distant from a ground (GND) of a work surface of the cryostat by 7 millimeters or more, and can be also aligned to the optical axis. As the charge reset means, a device in which a probe having a diameter of 7 millimeters is connected to a motor, and which can be turned on and off by a rotational motion is used. To reinforce a rotational torque, a solenoid with a spring is connected to the charge reset means. A tip end of the probe of the charge reset means is connected to the GND. The electrodes on the calcium fluoride substrate are introduced to and connected to a room temperature read circuit by constantan wires, respectively. A shield is applied to entirely cover the XY stage, whereby it is possible to prevent a stray light from being made incident on the photodetector, prevent a radiation light, and cool the entire weak light detection system to 4.2 K.

The photodetector for weak light according to the present invention operates in an environment in which the photodetector is cooled to about 4.2 K. Conventionally, the photodetectors for weak light do not operate at a capacity which can measure the number of photons unless it is cooled to about 100 mK. The photodetector for weak light according to the present invention, by contrast, can measure the number of photons in the temperature environment provided by liquid helium. The photodetector for weak light according to the present invention can be easily applied in various fashions.

Further, since the photodetector for weak light according to the present invention can measure the number of photons, it can be utilized for optical information technology, optical information processing technology, and the like.

Moreover, since the photodetector for weak light according to the present invention can detect a single photon, it can be utilized as experimental device for quantum optics experiments.

What is claimed is:

1. A method for manufacturing a photodetector for weak light, the photodetector for weak light comprising a circuit on a substrate, the circuit comprising light detection means and a field effect transistor (FET), the method comprising:
    a light detection means connection step for attaching the light detection means to the substrate, and connecting one end of an electrode of the light detection means to a first electrode provided in the peripheral portions of the substrate;
    an FET electrode-to-substrate electrode connection step for connecting a gate electrode of the FET to a second electrode, which is provided on the substrate and is connected to a third electrode provided in the peripheral portions of the substrate, and for connecting a source electrode and a drain electrode of the FET to a fourth electrode and a fifth electrode provided in the peripheral portions of the substrate, respectively;
    an external electrode connection step for connecting said first, third, fourth, and fifth electrodes to electrodes on a connection port;
    a light detection means-to-gate connection step of connecting a sixth electrode, which is an electrode of the light detection means other than the first electrode, to the second electrode to which the gate electrode of the FET is connected;
    a gate-external terminal disconnection step for disconnecting the second electrode, to which the sixth electrode of the light detection means and the gate electrode of the FET are connected, from the third electrode;
    a substrate mounting step for mounting the substrate on a support section above a work surface, wherein said substrate is elevated above the work surface by the support section; and
    wherein said FET electrode-substrate connection step occurs prior to said light detection means-to-gate connection step.

2. The method for manufacturing a photodetector for weak light according to claim 1, wherein elements including a capacitor and a resistor necessary to the circuit are connected after the light detection means-to-gate connection step, and before the gate-external terminal disconnection step.

3. The method for manufacturing a photodetector for weak light according to claim 1, wherein the light detection means is one of the group consisting of a PIN photodiode and an avalanche photodiode (APD).

4. The method for manufacturing a photodetector for weak light according to claim 1, wherein the FET is a GaAs JFET.

5. The method for manufacturing a photodetector for weak light according to claim 1, wherein the circuit comprising the light detection means and the field effect transistor (FET) is an integrating read circuit.

6. The method for manufacturing a photodetector for weak light according to claim 1, wherein the circuit comprising the light detection means and the field effect transistor (FET) is one of the group consisting of a capacitive trans-impedance amplifier (CTIA) circuit and a charge integrating amplifier (CIA) circuit.

7. A method for manufacturing a photodetector for weak light, the photodetector for weak light comprising a circuit on a substrate, the circuit comprising light detection means and a field effect transistor (FET), the method comprising:
    a light detection means connection step for attaching the light detection means to the substrate, and connecting one end of an electrode of the light detection means to a first electrode provided in the peripheral portions of the substrate;
    an FET electrode-to-substrate electrode connection step for connecting a gate electrode of the FET to a second electrode, which is provided on the substrate and is connected to a third electrode provided in the peripheral portions of the substrate, and for connecting a source electrode and a drain electrode of the FET to a fourth electrode and a fifth electrode provided in the peripheral portions of the substrate, respectively;

an external electrode connection step for connecting said first, third, fourth, and fifth electrodes to electrodes on a connection port;

a light detection means-to-gate connection step of connecting a sixth electrode, which is an electrode of the light detection means other than the first electrode, to the second electrode to which the gate electrode of the FET is connected; and a gate-external terminal disconnection step for disconnecting the second electrode, to which the sixth electrode of the light detection means and the gate electrode of the FET are connected, from the third electrode, wherein the circuit comprising the light detection means and the field effect transistor (FET) comprises:

the FET;

the light detection means connected to the gate electrode of the FET;

a capacitor connected to the gate electrode of the FET;

a resistor connected to the source electrode of the FET; and an operational amplifier connected to the source electrode of the FET.

8. The method for manufacturing a photodetector for weak light according to claim 7, wherein a capacity of the capacitor is 0.01 to 1 pico farad (pF).

9. The method for manufacturing a photodetector for weak light according to claim 7, wherein the capacitor has an area of 0.1 to 10 square millimeters (mm²), and a thickness of 0.1 to 0.5 millimeter (mm).

10. The method for manufacturing a photodetector for weak light according to claim 7, wherein a dielectric that constitutes the capacitor contains quartz glass.

11. A method for manufacturing a photodetector for weak light, the photodetector for weak light comprising a circuit on a substrate, the circuit comprising light detection means and a field effect transistor (FET), the method comprising:

a light detection means connection step for attaching the light detection means to the substrate, and connecting one end of an electrode of the light detection means to a first electrode provided in the peripheral portions of the substrate;

an FET electrode-to-substrate electrode connection step for connecting a gate electrode of the FET to a second electrode, which is provided on the substrate and is connected to a third electrode provided in the peripheral portions of the substrate, and for connecting a source electrode and a drain electrode of the FET to a fourth electrode and a fifth electrode provided in the peripheral portions of the substrate, respectively;

an external electrode connection step for connecting said first, third, fourth, and fifth electrodes to electrodes on a connection port;

a light detection means-to-gate connection step of connecting a sixth electrode, which is an electrode of the light detection means other than the first electrode, to the second electrode to which the gate electrode of the FET is connected; and a gate-external terminal disconnection step for disconnecting the second electrode, to which the sixth electrode of the light detection means and the gate electrode of the FET are connected, from the third electrode, wherein the circuit comprising the light detection means and the field effect transistor (FET) comprises:

the FET;

the light detection means connected to the gate electrode of the FET;

a first resistor connected to the source electrode of the FET;

an operational amplifier connected to the source electrode of the FET through the resistor; and a second resistor that connects a negative input terminal of the operational amplifier to an output terminal of the operational amplifier.

12. The method for manufacturing a photodetector for weak light according to claim 7, wherein a resistance value of the resistors is 100 kilo ohms (kΩ) to 30 mega ohms (MΩ).

13. The method for manufacturing a photodetector for weak light according to claim 11, wherein a resistance value of the resistors is 100 kilo ohms (kΩ) to 30 mega ohms (MΩ).

14. The method for manufacturing a photodetector for weak light according to claim 1, wherein a distance between the work surface and the substrate is 1 mm or more.

15. The method for manufacturing a photodetector for weak light according to claim 1, wherein a distance between the work surface and the substrate is 3 mm or more.

16. The method for manufacturing a photodetector for weak light according to claim 1, wherein a distance between the work surface and the substrate is 5 mm or more.

17. The method for manufacturing a photodetector for weak light according to claim 1, wherein a distance between the work surface and the substrate is 1 cm or more.

* * * * *